United States Patent [19]
Watai et al.

[11] Patent Number: 5,745,373
[45] Date of Patent: Apr. 28, 1998

[54] LOGIC CIRCUIT GENERATING METHOD AND APPARATUS

[75] Inventors: Hiroo Watai, Fuji; Akira Yamaoka, Hadano; Kazuhiko Matsumoto, Kawasaki; Hiromoto Sakaki, Yokohama, all of Japan

[73] Assignee: Hitachi, Ltd., Tokyo, Japan

[21] Appl. No.: 402,699

[22] Filed: Mar. 13, 1995

[30] Foreign Application Priority Data

Mar. 11, 1994 [JP] Japan .................. 6-067840

[51] Int. Cl.[6] .................................. G06F 17/50
[52] U.S. Cl. .................. 364/490; 364/488; 364/489; 364/491
[58] Field of Search .................. 364/488, 489, 364/490, 491; 395/500

[56] References Cited

U.S. PATENT DOCUMENTS

| | | | |
|---|---|---|---|
| 5,005,136 | 4/1991 | Van Berkel et al. | 364/489 |
| 5,229,953 | 7/1993 | Isozaki et al. | 364/490 |
| 5,426,591 | 6/1995 | Ginetti et al. | 364/489 |
| 5,459,673 | 10/1995 | Carmean et al. | 364/488 |
| 5,461,574 | 10/1995 | Matsunaga et al. | 364/489 |
| 5,475,605 | 12/1995 | Lin | 364/488 |
| 5,491,640 | 2/1996 | Sharma et al. | 364/489 |
| 5,493,504 | 2/1996 | Minato | 364/489 |
| 5,519,627 | 5/1996 | Mahmood et al. | 364/489 |
| 5,519,628 | 5/1996 | Russell et al. | 364/489 |
| 5,541,850 | 7/1996 | Vander Zanden et al. | 364/491 |

FOREIGN PATENT DOCUMENTS 62-297974  12/1987  Japan.

Primary Examiner—Kevin J. Teska
Assistant Examiner—Tyrone V. Walker
Attorney, Agent, or Firm—Fay, Sharpe, Beall, Fagan, Minnich & McKee

[57] ABSTRACT

A logic circuit generating method and apparatus generating logic circuits of a circuit system by minimizing the fan-out count of cells or cell macros constituting information specific to the circuit system. According to the method, a Boolean expression and the polarities of its input/output variables are input from a design master file of the apparatus. The Boolean expression is then transformed into a two-branch tree composed of nodes represented by the logical operators of that expression. In the two-branch tree, the nodes representing a parent and a child logical operator are converted into a single node, whereby a multiple-branch tree is generated. That is, a plurality of gates are connected to a single net, or signal line. A cell library is referenced so that cells are assigned initially to the multiple-branch tree thus obtained. The initial cell assignment is performed preferentially starting from the cell whose fan-out count is the largest. This is done to minimize the number of loads represented by the assigned cells (i.e., the number of cells connected to the output net). The number of gate stages is then evaluated. The stage count is minimized by reassigning the cells. Finally, the acquired gate logic is output to the design master file.

34 Claims, 6 Drawing Sheets

$Z_i = \overline{A}\ (0 \leq i \leq 2)$ $Z_i = A\ (3 \leq i \leq 4)$

| PARAMETER | POLARITY |
|---|---|
| A | P |
| Z0 | N |
| Z1 | N |
| Z2 | N |
| Z3 | P |
| Z4 | P |

| NO. | SYMBOL | CELL FAN-OUT | INPUT POLARITY | OUTPUT POLARITY |
|---|---|---|---|---|
| 1 | | 2 | P | P<br>P |
| 2 | | 2 | P | N<br>N |
| 3 | | 1 | P | N |

LOGIC CIRCUIT GENERATING METHOD AND APPARATUS

BACKGROUND OF THE INVENTION

1. Field of the Invention

The present invention relates to logic circuit generation, and, more particularly, to a method and apparatus for generating a logic circuit by adjusting the fan-out count of gates, cells, and cell macros based on a logical description embodied in a Boolean expression.

2. Description of the Related Art

In carrying out logic design, higher efficiency is pursued using techniques for boosting the functional level of a logic diagram described by a designer so that the objective logic circuit is generated automatically from a functional logic diagram derived from the functionally enhanced logic diagram.

Many methods have been proposed for this type of automatic logic circuit generation. The most common method transforms all logic descriptions such as a truth table and macros constituting a functional logic diagram into a Boolean expression, which is then transformed into a logic circuit that is described using specific parts.

In generating a logic circuit, it is necessary to optimize the number of gates and the number of gate stages so that the generated logic will satisfy constraints on implementing and mounting the logic circuit. One such method is disclosed illustratively in Japanese Patent Laid-open No. Sho 62-297974. This method allows a minimum number of gate stages to be generated logically under the constraint of minimum gate count. However, no consideration is given to fan-out of the gates, cells, or cell macros.

This conventional method minimizes the number of logic gates to be generated to constitute, illustratively, a CMOS circuit given the assumptions that the parts involved are all NAND/NOR gates, that pairing gates always exist (i.e., gates that become equivalent when transformed according to the De Morgan theorem), and that the fan-in counts involving single gates are continuous (i.e., a single gate may be fabricated with any number of inputs). That is, any single gate having a fan-in count between 1 and n (i.e., a fan-in count of 1, 2, . . . , or n involving a single gate) is available. For example, there is no possibility that the single gates having fan-in counts of, say, 2 and 4 would be missing; single gates of any fan-in count may be selected for use.

Where logic circuits are implemented using layout or mounting units called cells, some circuits may each be composed of a single basic logic gate (AND, OR, etc.); other circuits may each be constituted by a single mounting unit made of a plurality of basic logic gates (this is a single physical unit sometimes called a composite gate comprising, illustratively, two OR gates on the input side and one AND gate on the output side, the AND gate ANDing the outputs of the two OR gates). There are also circuits constituting the so-called embedding logic. It follows that the number of cells is not necessarily the same as the number of gates. As a result, minimizing the number of gates does not necessary lead to generating a logic circuit having the minimum number of cells.

If there exist, for example, two logic circuits each having the same gate count for the same Boolean expression, the circuit with the smaller cell fan-out count has less dispersion in wiring lengths than the circuit with the larger cell fan-out count. After automatic circuit layout, the circuit with the smaller cell fan-out count has less delay dispersion. That is, a logic circuit that is easy to implement in practice is generated by properly adjusting the fan-out count of mounting units. In cases where a composite cell comprising a plurality of cells is handled as a cell macro (a unit composed of wired cells), the component cells constituting the cell macro are arranged close to one another when mounted.

FIG. 3 is a logic circuit diagram showing a logic circuit whose fan-out count of upstream gates (called the gate fan-out count) is minimum, but whose fan-out count of upstream cells (called the cell fan-out count) is not minimum. In this example, the maximum gate fan-out count is 2. Portions 301, 302, and 303 enclosed by broken lines each correspond to a single cell.

Illustratively, the number of cells (the number of loads represented by cells) connected to the output net (output signal line) of an AND gate 304 is 2. That is, the cell fan-out count is 2. Since the cells 302 and 303 are each a one-gate cell, the gate fan-out count is also 2.

FIG. 4 is a logic circuit diagram showing a logic circuit whose gate fan-out count and cell fan-out count are both minimum, the circuit involving the same Boolean expression as those for the example of FIG. 3. In the example of FIG. 4, a portion 402 constitutes a single cell. Thus, the number of cells (the number of loads represented by cells) connected to the output net (output signal line) of an AND gate 403 is 1. That is, the cell fan-out count is 1. Because the cell 402 is a two-gate cell, the gate fan-out count is 2. These arrangements make the cell fan-out count of the FIG. 4 circuit smaller than that of the FIG. 3 circuit.

SUMMARY OF THE INVENTION

It is therefore an object of the present invention to overcome the above and other related problems, and to provide a logic circuit generating method for generating logic circuits of a circuit system by minimizing the fan-out counts of cells and cell macros (composite cells) constituting information unique to the circuit system in question, whereby a logic circuit system with minimum delay dispersion is generated and implemented advantageously for practical use.

According to one aspect of the invention, the logic circuit generating method performs a logic generation process for transforming a functional logic description embodied in a Boolean expression into logic connection information concerning a circuit system. The logic circuit generating method is performed by calculating the number of loads represented by cells acting as mounting units to be connected to each of the nets constituting the logic of the logic circuit system, and then selecting the result of the logic generation process so that the value derived by the calculating step regarding each of the nets is minimized.

According to another aspect of the invention, the logic circuit generating method is performed by calculating the number of loads represented by cell macros that may be located close to one another when connected to each of the nets constituting the logic of the logic circuit system, and then selecting the result of the logic generation process so that the value derived by the calculating step regarding each of the nets is minimized.

According to a further aspect of the invention, the logic circuit generating method includes the steps of calculating the number of loads represented by cells acting as mounting units to be connected to each of the nets constituting the logic of the logic circuit system, calculating the number of loads represented by cell macros that may be located close to one another when connected to each of the nets, and selecting the result of the logic generation process so that the value derived by the calculating steps regarding each of the nets is minimized.

The inventive logic circuit generating method outlined above minimizes the number of cells or cell macros connected to each signal line of a logic circuit. In other words, the method may be used to minimize the fan-out count of the upstream cells connected to each signal line, allowing lines carrying the same signals to be associated at the floor planning stage, so that delay differences are reduced.

DETAILED DESCRIPTION OF THE PREFERRED EMBODIMENTS

Figure 1:
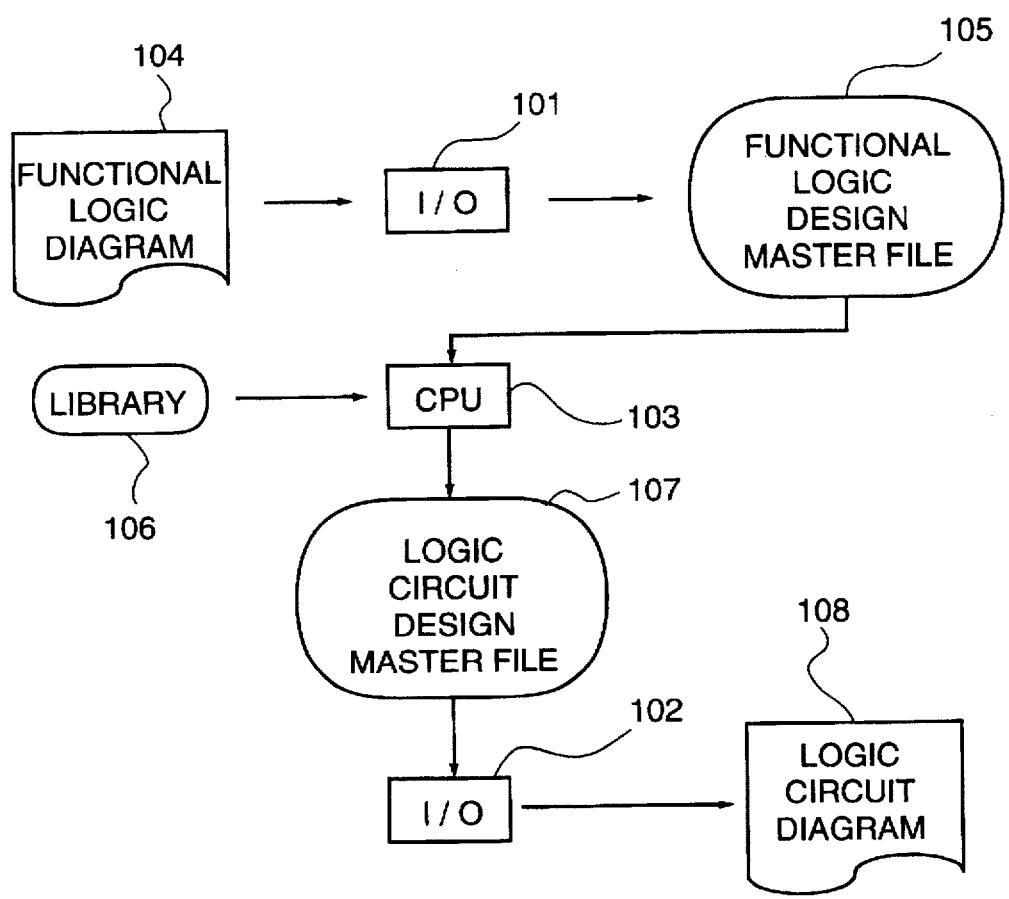
FIG. 1 is a block diagram of a logic generation system embodying the present invention.

A preferred embodiment of the invention will now be described with reference to the accompanying drawings. FIG. 1 is a block diagram of a logic generation system for carrying out the inventive method. The system comprises input/output units 101 and 102, a functional logic design master file 105, a processor 103, a cell library 106, and a logic circuit design master file 107. Each of these system blocks is described below.

The input/output unit 101 reads a functional logic diagram 104 describing a Boolean expression and the polarities of its input variables. The functional logic diagram 104 thus read by the input/output unit 101 is written to the design master file 105.

The processor 103 reads the Boolean expression and the polarities of its input/output variables from the design master file 105. The processor 103 then gains access to the cell library 106 to reference information therein about the parts constituting a specific circuit system. In so doing, the processor 103 transforms the Boolean expression into a logic circuit having a minimum cell fan-out count under the constraint of smallest number of gate stages. The logic circuit thus obtained is written to the design master file 107.

The input/output unit 102 reads the design master file 107, and outputs a logic circuit diagram 108 accordingly.

Figure 2:
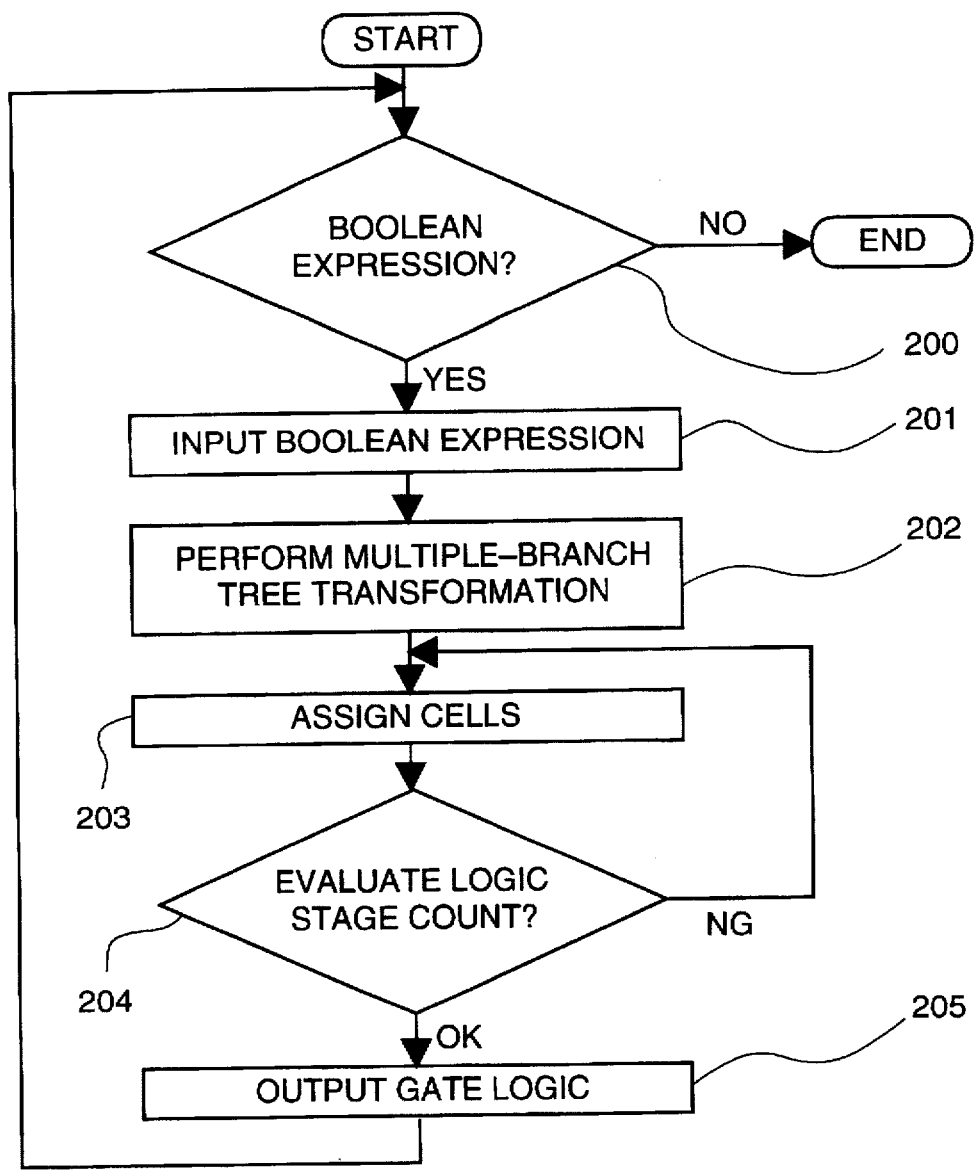
FIG. 2 is a flowchart of steps constituting a logic generation process according to the teachings of the present invention.
Figure 3:
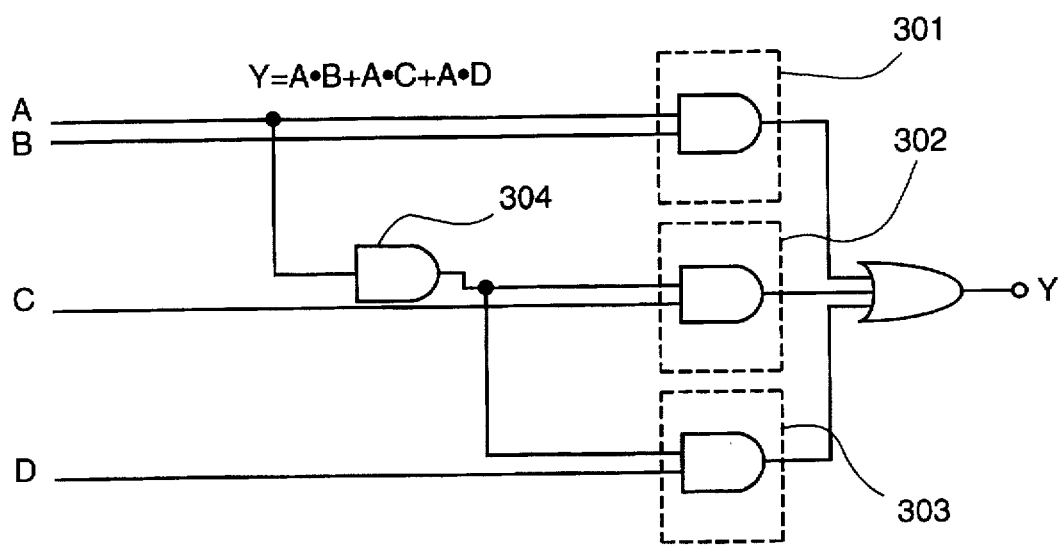
FIG. 3 is a logic circuit diagram showing a logic circuit whose gate fan-out count is minimal but whose physical gate fan-out count is not minimal.
Figure 4:
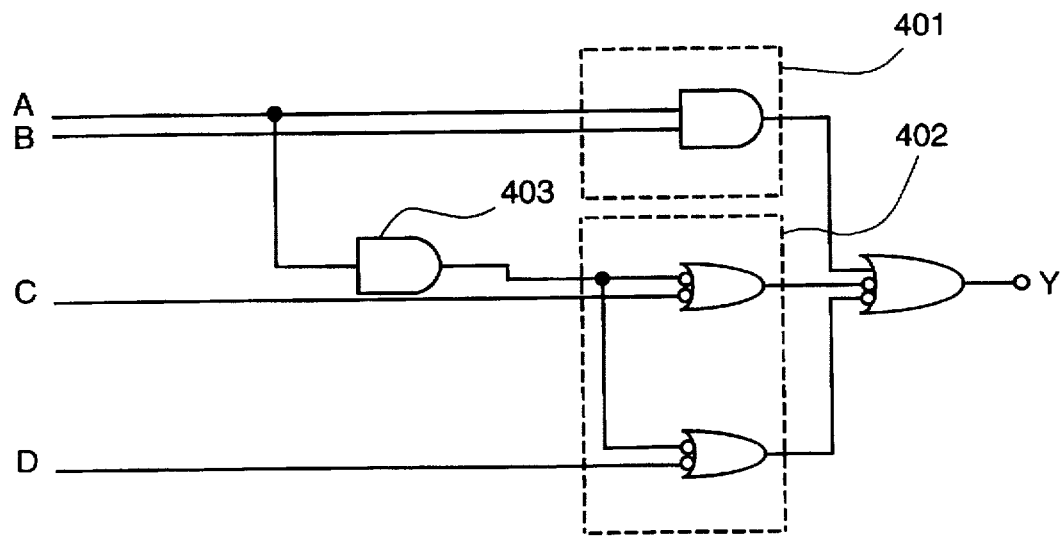
FIG. 4 is a logic circuit diagram showing a logic circuit whose gate fan-out count and whose physical gate fan-out count are both minimal.

FIG. 2 is a flowchart of steps constituting a logic generation process performed by the apparatus of FIG. 1. The following is a detailed, though illustrative, description of how these steps are carried out when the Boolean expression in FIG. 5 and the polarities of its input/output variables are input.

Step 201: This step inputs a Boolean expression and the polarities of its input/output variables from the design master file 105.

Figures 5, 6:
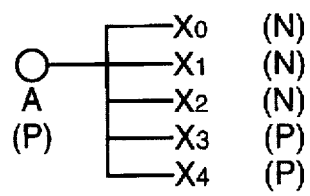
FIG. 5 is a view of a typical Boolean expression to be input and the polarities of its input/output variables.
FIG. 6 is a view of a multiple-branch tree derived from a Boolean expression.

FIG. 5 is a view of a typical Boolean expression 501 and the polarities of its input/output variables 502 for input in Step 201.

Step 202: This step performs multiple-branch tree transformation. Specifically, the Boolean expression input in Step 201 is transformed into a two-branch tree made of nodes representing the logical operators of the input Boolean expression. In the two-branch tree, the nodes representing parent and child logical operators are converted into a single node, whereby the multiple-branch tree is generated. That is, a plurality of gates are connected to a single net (signal line).

FIG. 6 is a view of a multiple-branch tree derived from the Boolean expression 501. In this example, five gates are connected to one net (signal line).

Step 203: This step references the cell library 106 to initially assign cells on a trial basis to the multiple-branch tree obtained in Step 202. At this point, the cell-assigning trial is performed preferentially starting from the cell whose fan-out count is the largest. This is done to minimize the number of loads represented by the assigned cells (i.e., the number of cells connected to the output net (output signal line)).

The cell library 106 stores a finite set of cells that may be accessed for a particular logic circuit. The cell library 106 is generated for each circuit system as follows: gates are grouped by gate type (OR, AND, EOR, NOT AMP). Within a gate group, cells are ranked, or prioritized, so as to minimize the number of gate stages, and then to minimize the number of gates. In each case, the cells should have maximum internal fan-outs so that the logic circuit ultimately has minimum cell fan-out. These gates are entered into the library along with their priorities and attributes (output polarities, input polarities, fan-in counts, gate counts, gate stage counts).

Figures 7, 8:
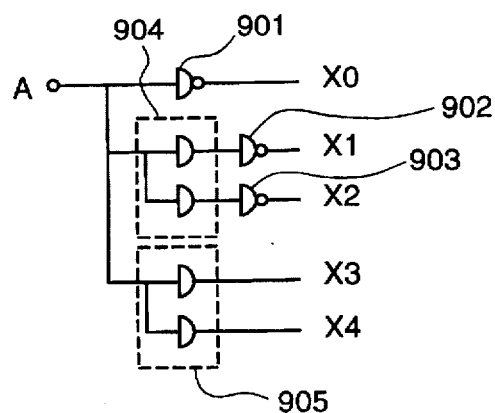
FIG. 7 shows an exemplary cell library.
FIG. 8 illustrates the result of having initially assigned cells to a multiple-branch tree.

FIG. 7 is a view showing part of a typical cell library.

FIG. 8 is a view illustrating the result of initially assigning cells to the multiple-branch tree 500 of FIG. 6. In FIG. 8, reference numerals 901, 902 and 903 indicate the result of having assigned entry No. 3 in the cell library of FIG. 7 to the multiple-branch tree 500; reference numerals 904 and 905 show the result of having assigned entry No. 1 in the cell library to the tree 500.

Step 204: This step evaluates the number of gate stages. In the example of FIG. 8, the paths X1 and X2 are developed in two stages. The path stage count is then minimized by reassigning the cells in Step 203.

Figure 9:
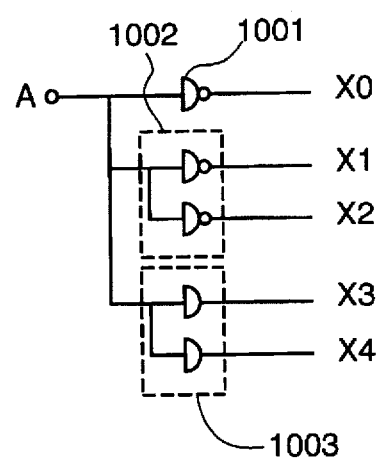
FIG. 9 depicts the result of having reassigned the cells to the multiple-branch tree of FIG. 8.

FIG. 9 depicts the result of having reassigned the cells to the multiple-branch tree 500 of FIG. 6. After the cells have been reassigned to the paths X1 and X2 which need to be improved, entry No. 2 of the cell library is assigned to a portion 1002, whereby the gate stage count is reduced to 1. Portions 1001 and 1003 correspond respectively to entry Nos. 3 and 1 in the cell library.

As a result, the gate fan-out count of the multiple-branch tree in FIG. 6 is 5 while the cell fan-out count thereof becomes 3.

Step 205: This step outputs the gate logic acquired in Steps 203 and 204 to the design master file 107.

Although the above embodiment deals with cells alone, this example is not limitative of the invention. Alternatively, the setup of FIG. 1 may be supplemented with a cell macro library so as to reassign cell macros as well, in a similar manner to the reassignment of cells as described above.

Thus, the disclosed embodiment generates a logic circuit that takes into account the fan-out count of gates and that of cells or cell macros at the same time, to minimize the fan-out count.

Although specific details of the invention have been described by way of the preferred embodiment, one of ordinary skill in the art will recognize modifications to the invention based upon the foregoing disclosure. All such modifications that rely upon the teachings by which the present invention has advanced the state of the art are properly considered within the spirit and scope of the invention.

We claim:

1. An automated machine-implemented method for transforming a logic expression into logic circuit connection information, comprising the steps of:

inputting a logic expression including input polarities and corresponding output polarities for the logic expression;

reducing the input logic expression to a tree structure representation of a logic circuit, said tree structure having a single node joining a net of the tree structure to all outputs of the tree structure, wherein said outputs correspond to said output polarities one-to-one;

developing, by retrieval from a library of logic circuit cells, a set of logic circuit cells that solve the input logic expression, each logic circuit cell containing at least one logic gate;

selecting one of the developed logic circuit cells for each branch of the tree structure based upon a first criterion of minimum cell fan-out from the node;

generating logic circuit connection information containing the selected logic circuit cells; and outputting the logic circuit connection information.

2. A method according to claim 1, further comprising the step, after said selecting step, of reselecting one of the developed set of logic circuit cells based upon a second criterion of minimum gate stages for a branch of the tree structure for which the selecting step selected a logic circuit cell having a greater-than-minimum number of gate stages.

3. A method according to claim 1, further comprising the steps of:

storing said input logic expression in a first master file memory; and retrieving said input logic expression from said first master file memory before performing said reducing step.

4. A method according to claim 3, further comprising the step of:

storing said generated logic circuit connection information in a second master file memory prior to said outputting step;

wherein said outputting step includes the step of retrieving the logic circuit connection information from said second master file memory.

5. A method according to claim 1, further comprising the step of developing the library of logic circuit cells, including grouping the logic circuit cells by logic operation and ranking the logic circuit cells within each logic operation group according to internal fan-out.

6. A method according to claim 5, wherein the rank of the logic circuit cells favors large internal fan-out to small internal fan-out.

7. An automated machine-implemented method for transforming a logic expression into logic circuit connection information, comprising the steps of:

inputting a logic expression including input polarities and corresponding output polarities for the logic expression;

reducing the input logic expression to a tree structure representation of a logic circuit, said tree structure having a single node joining a net of the tree structure to all outputs of the tree structure, wherein said outputs correspond to said output polarities one-to-one;

developing, by retrieval from a library of logic circuit cell macros, a set of logic circuit cell macros that solve the input logic expression, each logic circuit cell macro containing at least one logic gate;

selecting one of the developed logic circuit cell macros for each branch of the tree structure based upon a first criterion of minimum cell fan-out from the node;

generating logic circuit connection information containing the selected logic circuit cell macros; and outputting the logic circuit connection information.

8. A method according to claim 7, further comprising the step, after said selecting step, of reselecting one of the developed logic circuit cell macros based upon a second criterion of minimum gate stages for a branch of the tree structure for which the selecting step selected a logic circuit cell macro having a greater-than-minimum number of gate stages.

9. A method according to claim 7, further comprising the steps of:

storing said input logic expression in a first master file memory; and retrieving said input logic expression from said first master file memory before performing said reducing step.

10. A method according to claim 9, further comprising the step of:

storing said generated logic circuit connection information in a second master file memory prior to said outputting step;

wherein said outputting step includes the step of retrieving the logic circuit connection information from said second master file memory.

11. A method according to claim 7, further comprising the step of developing the library of logic circuit cell macros, including grouping the logic circuit cell macros by function and ranking the logic circuit cell macros within each function group according to internal fan-out.

12. A method according to claim 11, wherein the rank of the logic circuit cell macros favors large internal fan-out to small internal fan-out.

13. An automated machine-implemented method for transforming a logic expression into logic circuit connection information, comprising the steps of:

inputting a logic expression including input polarities and corresponding output polarities for the logic expression;

reducing the input logic expression to a tree structure representation of a logic circuit, said tree structure having a single node joining a net of the tree structure to all outputs of the tree structure, wherein said outputs correspond to said output polarities one-to-one;

developing, by retrieval from a library of logic circuit cells and cell macros, a set of logic circuit cells and cell macros that solve the input logic expression, each logic circuit cell and cell macro containing at least one logic gate;

selecting one of the developed logic circuit cells and cell macros for each branch of the tree structure based upon a first criterion of minimum cell fan-out from the node;

generating logic circuit connection information containing the selected logic circuit cells and cell macros; and outputting the logic circuit connection information.

14. A method according to claim 13, further comprising the step, after said selecting step, of reselecting one of the developed logic circuit cells and cell macros based upon a second criterion of minimum gate stages for a branch of the tree structure for which the selecting step selected a logic circuit cell or cell macro having a greater-than-minimum number of gate stages.

15. A method according to claim 13, further comprising the steps of:

storing said input logic expression in a first master file memory; and retrieving said input logic expression from said first master file memory before performing said reducing step.

16. A method according to claim 15, further comprising the step of:

storing said generated logic circuit connection information in a second master file memory prior to said outputting step;

wherein said outputting step includes the step of retrieving the logic circuit connection information from said second master file memory.

17. A method according to claim 13, further comprising the step of developing the library of logic circuit cells and cell macros, including grouping the logic circuit cells and cell macros by function and ranking the logic circuit cells and cell macros within each function group according to internal fan-out.

18. A method according to claim 17, wherein the rank of the logic circuit cells and cell macros favors large internal fan-out to small internal fan-out.

19. An automated machine-implemented method for transforming a logic expression into a logic circuit, comprising the steps of:

inputting a logic expression including input polarity and corresponding output polarity for the logic expression;

determining a basic logic circuit representation of the input logic expression;

developing, by retrieval from a library of logic circuit loads, a set of logic circuit loads that solve the input logic expression, each logic circuit load containing at least one logic gate and being connected to at least one net of the basic logic circuit representation;

selecting at least one of the loads developed in the developing step for connection to each of the nets of the basic logic circuit representation so that the total number of loads connected to each net is minimized; and generating a logic circuit containing the selected loads.

20. A method according to claim 19, wherein each load is a cell macro containing a plurality of logic circuit cells.

21. A method according to claim 19, wherein said loads include at least one cell macro and at least one cell that is not part of a cell macro.

22. A method according to claim 19, wherein the selecting step is performed so that each selected load includes an input circuit node from which the internal fan-out of the selected load is maximized.

23. A method according to claim 19, wherein the selecting step is performed so that each load is selected based upon a criterion of minimum signal delay for the net to which the selected load is connected.

24. A method according to claim 19, further comprising the step of developing the library of logic circuit loads, including grouping the logic circuit loads by function and ranking the logic circuit loads within each function group according to internal fan-out.

25. A method according to claim 24, wherein the rank of the logic circuit loads favors large internal fan-out to small internal fan-out.

26. In an automated machine-implemented method for generating a logic circuit from an input logic expression by selecting logic gates that solve the logic expression, the improvement comprising the steps of:

establishing a library of logic circuit cells, each logic circuit cell containing at least one logic gate, from which logic circuit cells are selected to solve the input logic expression;

wherein the logic circuit cells are grouped by logic operation, and wherein the logic circuit cells within each logic operation group are ranked according to internal fan-out for selection to solve the input logic expression.

27. A method according to claim 26, wherein the logic circuit cells belong to each logic operation group are secondarily prioritized according to number of gate stages.

28. A method according to claim 27, wherein the logic circuit cells of each logic operation group are tertiarily prioritized according to number of gates.

29. A programmed logic circuit synthesis system for synthesizing a logic circuit that satisfies a logical expression, comprising:

input means for inputting a logic expression including input polarities and corresponding output polarities for the logic expression;

reducing means for reducing the input logic expression to a tree structure representation of a logic circuit, said tree structure having a single node joining a net of the tree structure to all outputs of the tree structure, wherein said outputs correspond to said output polarities one-to-one;

a library for storing logic circuit cells;

developing means for developing, by retrieval from the library, a set of solutions to the input logic expression, each solution including at least one of the logic circuit cells, each logic circuit cell containing at least one logic gate;

selecting means for selecting one of the developed solutions for each branch of the tree structure based upon a first criterion of minimum cell fan-out from the node;

generating means for generating logic circuit connection information containing the selected solution; and output means for outputting the logic circuit connection information.

30. A system according to claim 29, wherein the library further stores cell macros; and wherein the developing means further develops a solution to the input logic expression that includes at least one of the cell macros.

31. A system according to claim 29, further comprising:

a first master file memory for receiving and storing the input logic expression, and from which the reducing means retrieves the input logic expression for reduction to the tree structure representation.

32. A system according to claim 31, further comprising:

a second master file memory for receiving and storing the logic circuit information generated by the generating means, and from which the outputting means retrieves the logic circuit connection information for output.

33. An automated machine-implemented method for designing a logic circuit layout for an integrated circuit device having minimized wiring dispersion and delay dispersion, comprising the steps of:

inputting a logic expression including input polarities and corresponding output polarities for the logic expression;

reducing the input logic expression to a tree structure representation of a logic circuit, said tree structure having a single node joining a net of the tree structure to all outputs of the tree structure, wherein said outputs correspond to said output polarities one-to-one;

associating and designing lines of logically equivalent signals emanating from the node in a common mounting position that minimizes wiring dispersion and delay dispersion;

developing, by retrieval from a library of logic circuit cells, a set of logic circuit cells that solve the input logic expression, each logic circuit cell containing at least one logic gate;

selecting one of the developed logic circuit cells for each branch of the tree structure based upon a first criterion of minimum cell fan-out from the node;

generating logic circuit connection information containing the selected logic circuit cells and the associated and designed lines; and outputting the logic circuit connection information.

34. A programmed logic circuit layout design system for synthesizing and designing a logic circuit layout for an integrated circuit device, comprising:

input means for inputting a logic expression including input polarities and corresponding output polarities for the logic expression;

reducing means for reducing the input logic expression to a tree structure representation of a logic circuit, said tree structure having a single node joining a net of the tree structure to all outputs of the tree structure, wherein said outputs correspond to said output polarities one-to-one;

means for associating and designing lines of logically equivalent signals emanating from the node in a common mounting position that minimizes wiring dispersion and delay dispersion;

a library for storing logic circuit cells;

developing means for developing, by retrieval from the library, a set of solutions to the input logic expression, each solution including at least one of the logic circuit cells, each logic circuit cell containing at least one logic gate;

selecting means for selecting one of the developed logic circuit cells for each branch of the tree structure based upon a first criterion of minimum cell fan-out from the node;

generating means for generating logic circuit connection information containing the selected logic circuit cells and the associated and designed lines;

output means for outputting the logic circuit connection information.

* * * * *